US011594671B2

(12) United States Patent
Ohashi et al.

(10) Patent No.: US 11,594,671 B2
(45) Date of Patent: Feb. 28, 2023

(54) ULTRASONIC DEVICE AND ULTRASONIC SENSOR

(71) Applicant: SEIKO EPSON CORPORATION, Tokyo (JP)

(72) Inventors: Koji Ohashi, Matsumoto (JP); Hironori Suzuki, Chino (JP); Chikara Kojima, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 648 days.

(21) Appl. No.: 16/681,980

(22) Filed: Nov. 13, 2019

(65) Prior Publication Data

US 2020/0152857 A1    May 14, 2020

(30) Foreign Application Priority Data

Nov. 14, 2018    (JP) .............................. JP2018-213386

(51) Int. Cl.

| | | |
|---|---|---|
| *H01L 41/113* | (2006.01) | |
| *B06B 1/06* | (2006.01) | |
| *H04R 17/00* | (2006.01) | |
| *G01H 11/08* | (2006.01) | |
| *G01S 15/08* | (2006.01) | |
| *G01S 15/42* | (2006.01) | |
| *G01S 3/808* | (2006.01) | |
| *H02N 2/00* | (2006.01) | |

(52) U.S. Cl.
CPC ........ *H01L 41/1132* (2013.01); *B06B 1/0644* (2013.01); *G01H 11/08* (2013.01); *G01S 3/808* (2013.01); *G01S 15/08* (2013.01); *G01S 15/42* (2013.01); *H02N 2/001* (2013.01); *H04R 17/00* (2013.01)

(58) Field of Classification Search
CPC ......... B06B 1/064; B06B 1/0644; B06B 1/06; H04R 17/00
USPC ......................................... 310/322, 334, 335
See application file for complete search history.

(56) References Cited

U.S. PATENT DOCUMENTS

| | | | | |
|---|---|---|---|---|
| 5,317,229 | A | * | 5/1994 | Koehler ................ B06B 1/0611 310/317 |
| 2010/0202253 | A1 | | 8/2010 | Nakamura |
| 2012/0188850 | A1 | | 7/2012 | Nakamura |
| 2018/0182949 | A1 | * | 6/2018 | Kojima ............... H01L 41/1132 |

FOREIGN PATENT DOCUMENTS

JP        2010-183437 A    8/2010

* cited by examiner

*Primary Examiner* — Derek J Rosenau
(74) *Attorney, Agent, or Firm* — Oliff PLC

(57) ABSTRACT

An ultrasonic device according to an aspect of the present disclosure includes a substrate in which an opening section piercing through the substrate in a thickness direction is provided, a vibration plate provided on the substrate to close the opening section, a piezoelectric element provided in a position corresponding to the opening section on a first surface at the opposite side of the substrate side of the vibration plate, and an elastic layer provided in contact with a second surface at the substrate side of the vibration plate at the inner side of the opening section of the substrate. The elastic layer includes a curved surface recessed to the vibration plate side at the opposite side of the vibration plate side.

6 Claims, 7 Drawing Sheets

ND ULTRASONIC
SENSOR

The present application is based on, and claims priority from JP Application Serial Number 2018-213386, filed Nov. 14, 2018, the disclosure of which is hereby incorporated by reference herein in its entirety.

BACKGROUND

1. Technical Field

The present disclosure relates to an ultrasonic device and an ultrasonic sensor.

2. Related Art

There has been known an ultrasonic device of a diaphragm type that makes use of vibration of a diaphragm (see, for example, JP A-2010-183437 (Patent Literature 1)).

The ultrasonic device (an ultrasonic sensor) described in Patent Literature 1 includes a vibration plate (a diaphragm) provided to close opening sections of a substrate and piezoelectric elements provided in vibration regions corresponding to the opening sections in the vibration plate. The ultrasonic device described in Patent Literature 1 applies a voltage to the piezoelectric elements to vibrate the vibration regions where the piezoelectric elements are provided and transmits ultrasound into the air.

In general, in an ultrasonic probe that makes ultrasound incident on an object, a difference of acoustic impedance is large between piezoelectric elements and the object. A layer (an acoustic matching layer) for matching the acoustic impedance is provided to prevent the ultrasound from being reflected on the object.

On the other hand, in the ultrasonic device described in Patent Literature 1, the acoustic matching layer described above is unnecessary because the vibration of the vibration plate directly acts on a medium (air) and generates a compressional wave. Therefore, the acoustic matching layer is not provided. The surface on the opposite side of the piezoelectric element side in the vibration plate is exposed to the medium (the air).

In the ultrasonic device of the diaphragm type described in Patent Literature 1, reception accuracy of the ultrasound is deteriorated because a Q value of the vibration plate is set high. For example, even when slight disturbance vibration is input to the ultrasonic device, a reception signal is output as noise. When vibration (reverberation vibration) of the vibration regions at the time of the transmission of the ultrasound continues for a long time and the vibration regions receive a reflected wave of the ultrasound from the object, it is difficult to distinguish a signal by the reverberant vibration and a signal involved in the reception of the reflected wave.

Therefore, in order to solve the problems described above, it is conceivable to provide elastic layers in the opening sections of the substrate and cause the elastic layers to absorb excess vibration.

However, when such an elastic layer is provided, even if reception accuracy of the ultrasound is improved, reception sensitivity of the ultrasound is deteriorated because a displacement amount in the vibration regions of the vibration plate decreases. Consequently, detection sensitivity of the ultrasonic sensor is also deteriorated.

SUMMARY

An ultrasonic device according to an aspect of the present disclosure includes: a substrate in which an opening section piercing through the substrate in a thickness direction is provided; a vibration plate provided on the substrate to close the opening section; a piezoelectric element provided in a position corresponding to the opening section on a first surface on an opposite side of the substrate side of the vibration plate; and an elastic layer provided in contact with a second surface at the substrate side of the vibration plate at an inner side of the opening section of the substrate. The elastic layer includes a curved surface recessed to the vibration plate side at an opposite side of the vibration plate side.

In the ultrasonic device according to the aspect, a curvature of the curved surface may be set within a range of 10,000 to 20,000.

In the ultrasonic device according to the aspect, the elastic layer may have thickness of 20 μm or more and 40 μm or less in a thickness direction of the substrate.

An ultrasonic sensor according to an aspect of the present disclosure includes: the ultrasonic device described above; and a control section configured to control the ultrasonic device.

DESCRIPTION OF EXEMPLARY EMBODIMENTS

First Embodiment

An ultrasonic device 10 according to an embodiment of the present disclosure is explained with reference to FIGS. 1 and 2.

Figure 1:
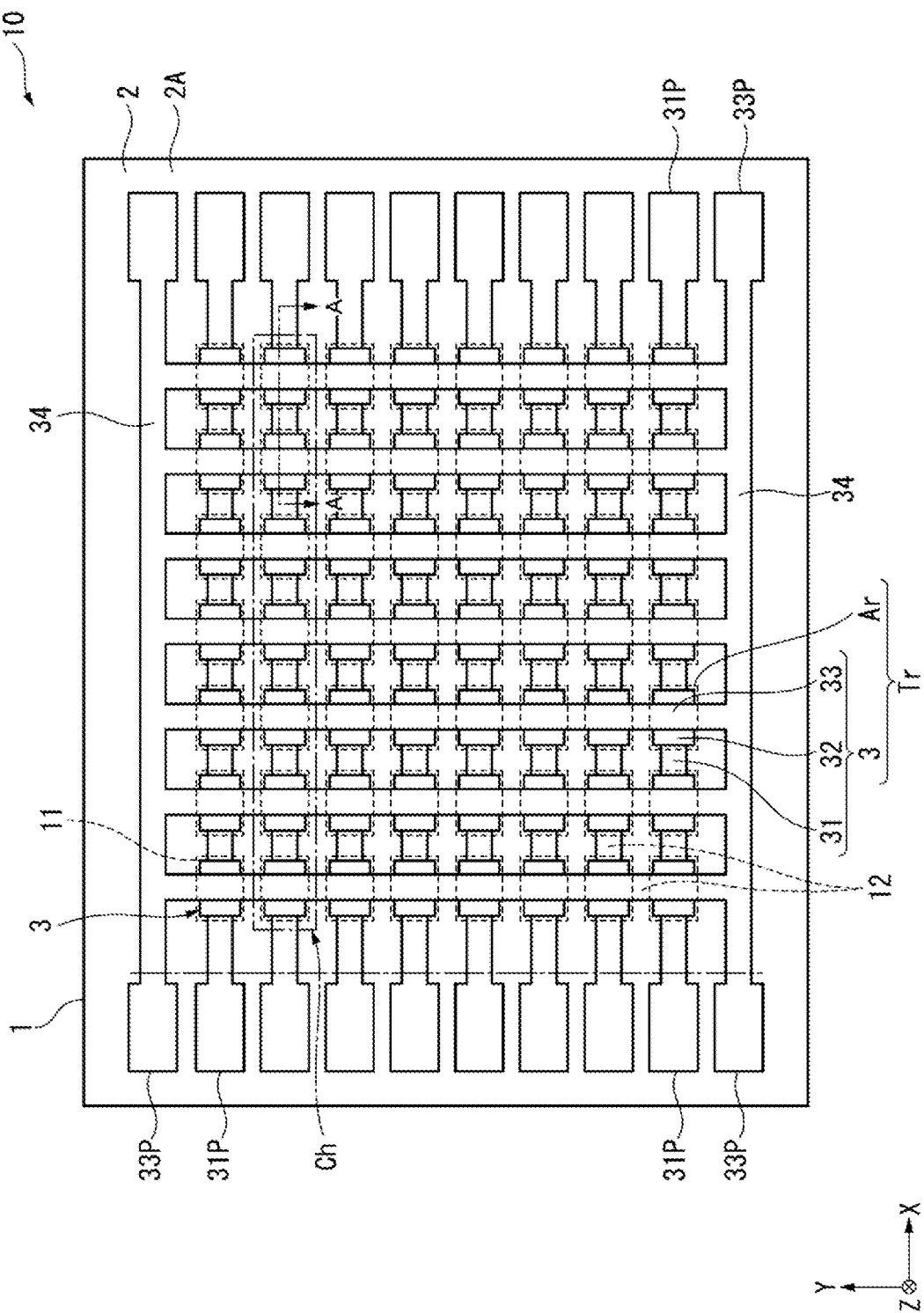
FIG. 1 is a plan view showing a schematic configuration of an ultrasonic device according to a first embodiment.
Figure 2:
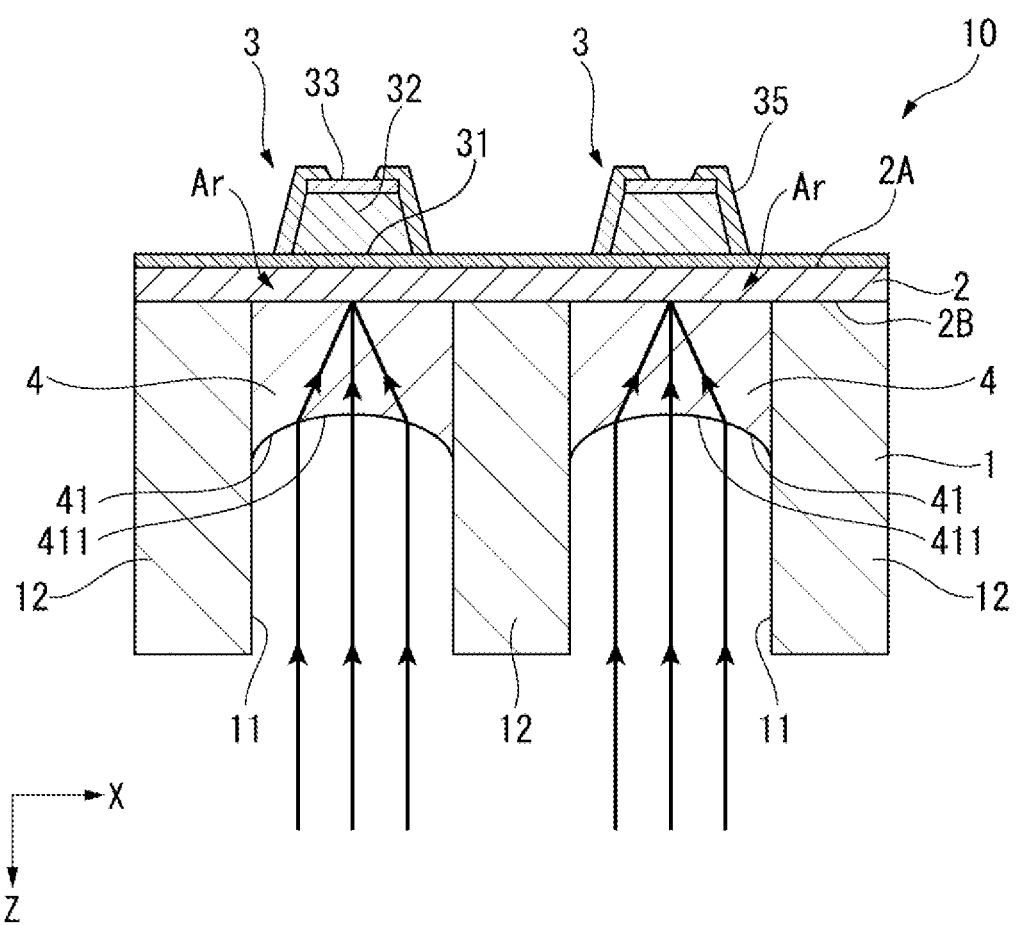
FIG. 2 is a sectional view showing an example of the ultrasonic device corresponding to an A-A line in FIG. 1.

FIG. 1 is a plan view of a part of the ultrasonic device 10 viewed from a thickness direction. FIG. 2 is a sectional view of the ultrasonic device 10 corresponding to an A-A line in FIG. 1.

Overall Configuration of the Ultrasonic Device

The ultrasonic device 10 includes a substrate 1, a vibration plate 2 provided on a principal plane at one side of the substrate 1, a plurality of piezoelectric elements 3 provided on the vibration plate 2, and elastic layers 4 provided at the opposite side of the piezoelectric elements 3 with respect to the vibration plate 2.

In the following explanation, a substrate thickness direction of the substrate 1 is represented as a Z direction. Two axial directions orthogonal to the Z direction are respectively represented as an X direction and a Y direction.

The substrate 1 is a semiconductor substrate of silico or the like. A plurality of opening sections 11 piercing through the substrate 1 in the Z direction are provided in the substrate 1. The plurality of opening sections 11 are disposed in a two-dimensional array shape along the X direction and the Y direction in a plan view from the Z direction. Portions surrounding the opening sections 11 on the substrate 1 are referred to as wall sections 12.

The vibration plate 2 is a laminated body formed of, for example, silicon oxide and zirconium oxide. The thickness dimension of the vibration plate 2 is sufficiently small with respect to the substrate 1. The vibration plate 2 is provided on a principal plane on one side (a −Z side) of the substrate 1 to close the opening sections 11 of the substrate 1. In other words, the vibration plate 2 is supported by the wall sections 12 at the −Z side of the substrate 1.

In the vibration plate 2, portions overlapping the opening sections 11 in the plan view from the Z direction, that is, regions surrounded by the wall sections 12 are vibration regions Ar of the vibration plate 2. The vibration plate 2 includes a plurality of vibration regions Ar capable of vibrating.

In this embodiment, in the vibration plate 2, a surface at the opposite side of the substrate 1 side (on the −Z side) is represented as a first surface 2A and a surface at the substrate 1 side (a +Z side) is represented as a second surface 2B. The plurality of piezoelectric elements 3 are provided in an array shape on the first surface 2A of the vibration plate 2. The substrate 1 is joined to the second surface 2B of the vibration plate 2.

The piezoelectric element 3 is provided for each of the vibration regions Ar of the vibration plate 2. The piezoelectric element 3 is configured by laminating a first electrode 31, a piezoelectric layer 32, and a second electrode 33 in order on the first surface 2A of the vibration plate 2. The first electrode 31 and the second electrode 33 are configured by a conductive layer (a single layer or a double layer) of, for example, iridium or titanium. The piezoelectric layer 32 is configured by, for example, PZT (lead zirconate titanate).

The first electrode 31 or the second electrode 33 is common in rows in the X direction or the Y direction of the plurality of piezoelectric elements 3.

Specifically, a plurality of first electrodes 31 are linearly formed along the X direction. First electrode terminals 31P are respectively provided at both end portions of the first electrodes 31. A plurality of second electrodes 33 are linearly formed along the Y direction. Both end portions of the second electrodes 33 are respectively coupled to common electrode lines 34. The common electrode lines 34 are respectively disposed on both sides in the Y direction with respect to areas where the plurality of vibration regions Ar are disposed. The common electrode lines 34 are linearly formed along the X direction. Second electrode terminals 33P are respectively provided at both end portions of the common electrode lines 34.

The first electrode 31 and the second electrode 33 cross each other in each of the vibration regions Ar in the plan view from the Z direction. The piezoelectric element 3 is configured by the crossing part.

The piezoelectric layer 32 is disposed between the first electrode 31 and the second electrode 33 in each of the vibration regions Ar. A protection film 35 (see FIG. 2) is provided on the side surface portion of the piezoelectric layer 32. In FIG. 1, illustration of the protection film 35 is omitted.

One ultrasonic transducer Tr is configured by a combination of the vibration region Ar of the vibration plate 2 and the piezoelectric element 3 provided in the vibration region Ar. In the ultrasonic device 10 in this embodiment, a plurality of ultrasonic transducers Tr are disposed in a matrix shape along the X direction and the Y direction.

In the ultrasonic transducer Tr, a pulse wave voltage having a predetermined frequency is applied between the first electrode 31 and the second electrode 33, whereby the piezoelectric layer 32 is bent and the vibration region Ar vibrate. Consequently, ultrasound is transmitted.

When ultrasound propagating toward the ultrasonic device 10 vibrates the vibration region Ar of the vibration plate 2, a potential difference occurs between upper and lower parts of the piezoelectric layer 32 in the vibration region Ar. Therefore, it is possible to detect received ultrasound by detecting a potential difference that occurs between the first electrode 31 and the second electrode 33.

In this embodiment, the ultrasonic transducer Tr transmits ultrasound in a direction from the first surface 2A side (the −Z side) of the vibration plate 2 to the second surface 2B side (the +Z side).

In this embodiment, the first electrode 31 is common to the plurality of ultrasonic transducers Tr disposed in the X direction. A transmission and reception row Ch of 1 CH (channel) is configured by the ultrasonic transducers Tr. The ultrasonic device 10 of a one-dimensional array structure is configured by disposing a plurality of transmission and reception rows Ch of the one channel along the Y direction.

Configuration of the Elastic Layer

An elastic layer 4 is disposed in each of the opening sections 11 of the substrate 1, that is, spaces surrounded by the vibration plate 2 and the wall sections 12 of the substrate 1. The elastic layer 4 is configured by an elastic material having a Young's modulus equal to or smaller than 10 MPa such as silicone or various rubber materials. The elastic layer 4 functions as a so-called damper layer.

Specifically, the elastic layer 4 is provided in contact with the second surface 2B of the vibration plate 2 in the opening section 11. The elastic layer 4 absorbs excess vibration of the vibration plate 2 to thereby improve reception accuracy of ultrasound. With such an elastic layer 4, when slight disturbance vibration is input to the ultrasonic device 10, it is possible to suppress a reception signal from being output as noise. In the ultrasonic device 10, it is possible to reduce a time in which vibration (reverberation vibration) of the vibration region Ar at the time of transmission of ultrasound continues.

The thickness of the elastic layer 4 can be set as appropriate within a range in which the elastic layer 4 is fit in the opening section 11 of the substrate 1. In this embodiment, as shown in FIG. 2, the thickness of the elastic layer 4 is set to approximately one third of the thickness of the substrate 1 (e.g., 70 μm). However, the thickness of the elastic layer 4 is not limited to this.

In the following explanation, when "the thickness of the elastic layer 4" is simply referred to, this indicates the thickness of the elastic layer 4 corresponding to the center portion of the opening section 11 of the substrate 1 (thickness corresponding to a bottom portion of a concave section 41 explained below).

The function of the elastic layer 4 as the damper layer is improved as the thickness of the elastic layer 4 is set larger. However, a reception voltage at the time when the ultrasonic device 10 receives ultrasound decreases as the thickness of the elastic layer 4 is larger. That is, reception sensitivity of ultrasound is deteriorated as the thickness of the elastic layer 4 is larger.

Figure 3:
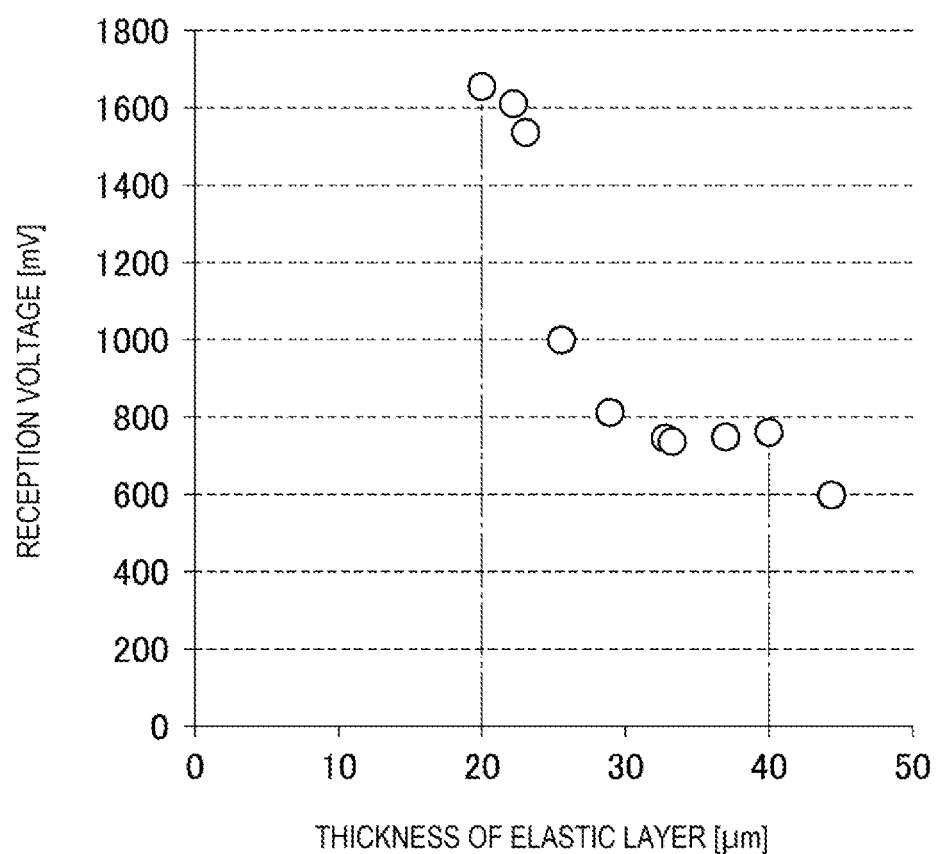
FIG. 3 is a diagram showing a relation between the thickness of an elastic layer and a reception voltage of the ultrasonic device.

FIG. 3 is a diagram showing a relation between the thickness of the elastic layer 4 and a reception voltage of the ultrasonic device 10. In FIG. 3, the Young's modulus of the elastic layer 4 is set to 10 MPa and the curvature of a curved surface 411 explained bellow is set to 15,000.

In this embodiment, as shown in FIG. 3, it is desirable to set the thickness of the elastic layer 4 to 40 μm or less with an aim that a sufficient reception voltage equal to or larger than 700 mV can be obtained. It is desirable to set the thickness of the elastic layer 4 to 30 μm or less in order to obtain a more satisfactory reception voltage.

As shown in FIG. 3, reception sensitivity of ultrasound is improved as the thickness of the elastic layer 4 is smaller. However, when the thickness of the elastic layer 4 is too small, an ability of absorbing excess vibration of the vibration plate 2 decreases. The elastic layer 4 cannot play the original function of the damper layer. Therefore, in this embodiment, it is desirable to set the thickness of the elastic layer 4 to 20 μm or more with am aim that a period in which reverberation vibration occurs can be reduced to a half or less compared with when the elastic layer 4 is not provided.

Consequently, in the ultrasonic device 10 in this embodiment, it is possible to improve reception accuracy of ultrasound and suppress deterioration in reception sensitivity of ultrasound by setting the thickness of the elastic layer 4 to 20 μm or more and 40 μm or less, more desirably 20 μm or more and 30 μm or less.

Curved Surface of the Elastic Layer

In the elastic layer 4, a concave section 41 recessed to the vibration plate 2 side (the −Z side) is provided in a part facing the opposite side of the vibration plate 2 side (facing the +Z side). The concave section 41 includes a curved surface 411 curved to be recessed to the −Z side. The curved surface 411 is curved to be close to the vibration plate 2 from a boundary portion between the elastic layer 4 and the opening section 11 to the center portion of the opening section 11 in the plan view from the Z direction.

Figure 4:
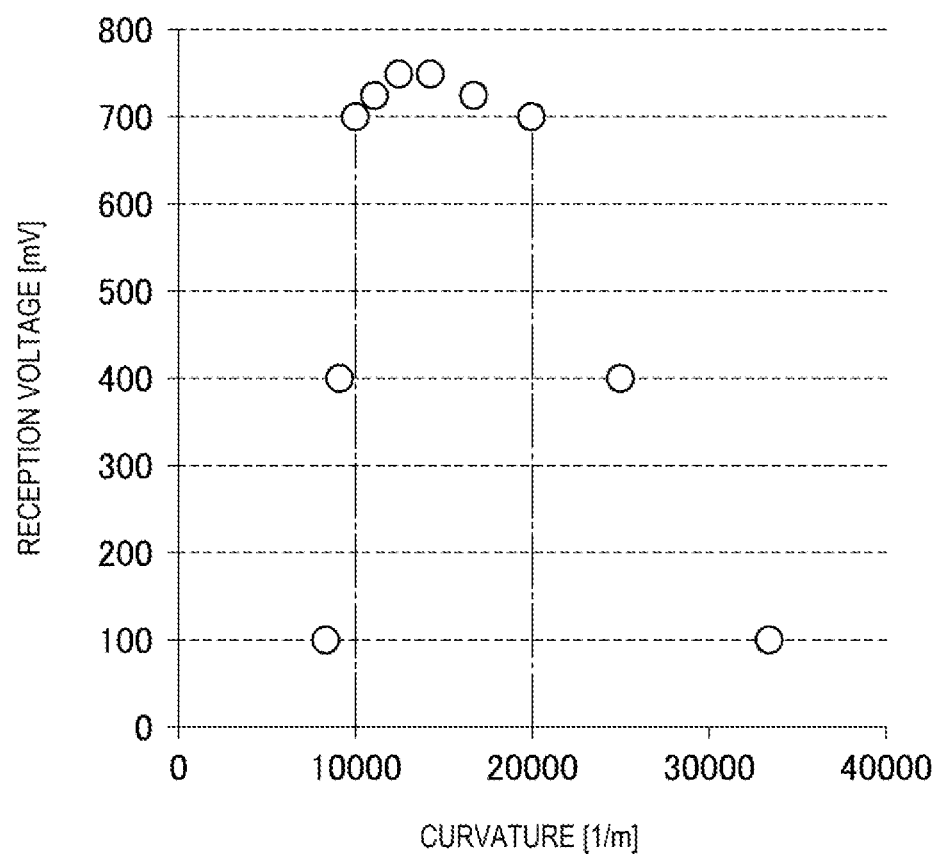
FIG. 4 is a diagram showing a relation between a curvature of a curved surface of the elastic layer and the reception voltage of the ultrasonic device.

FIG. 4 is a diagram showing a relation between the curvature of the curved surface 411 and a reception voltage of the ultrasonic device 10. In FIG. 4, the Young's modulus of the elastic layer 4 is set to 10 MPa and the thickness of the elastic layer 4 is set to 30 μm.

In this embodiment, as shown in FIG. 4, it is desirable to set the curvature of the curved surface 411 within a range of 10,000 to 20,000 with an aim that a sufficient reception voltage equal to or larger than 700 mV can be obtained.

The curved surface 411 may be a spherical surface having a uniform curvature or may be an aspherical surface flat in the bottom portion of the concave section 41 and having a large curvature in a portion close to the edge of the concave section 41.

A manufacturing method for the elastic layer 4 including the concave section 41 is not particularly limited. A meniscus phenomenon that occurs when a liquid material of the elastic layer 4 is filled in the opening section 11 may be used. Alternatively, after the liquid material of the elastic layer 4 is filled in the opening section 11, the material of the elastic layer 4 may be hardened in a state in which a die having a convex section corresponding to the shape of the concave section 41 is inserted into the opening section 11.

Effects of this Embodiment

Figure 7:
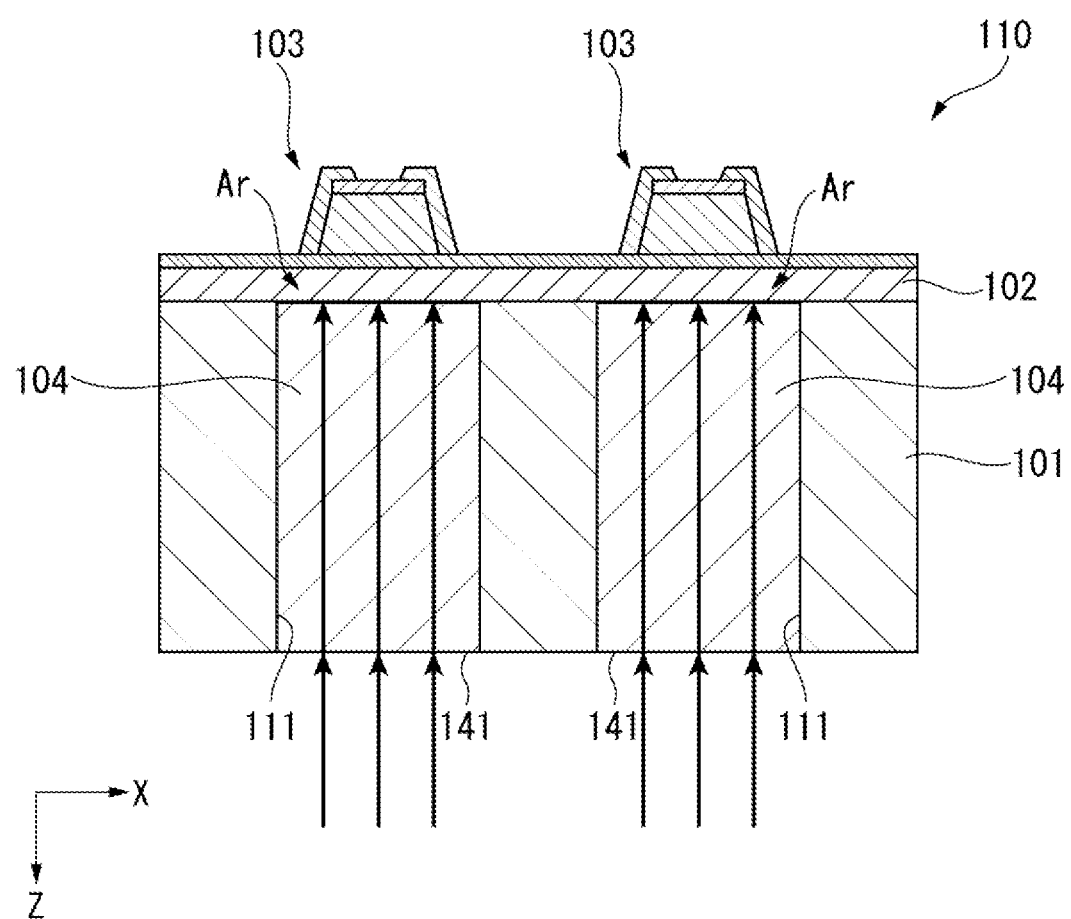
FIG. 7 is a sectional view showing an ultrasonic device according to a comparative example.

In order to explain effects of the ultrasonic device 10 in this embodiment, first, a comparative example shown in FIG. 7 is explained.

As shown in FIG. 7, in an ultrasonic device 110 in the comparative example, an elastic layer 104 is provided in an opening section 111 of a substrate 101. The elastic layer 104 is in contact with the vibration region Ar at the opposite side of a piezoelectric element 103 with respect to a vibration plate 102. In the ultrasonic device 110, the elastic layer 104 absorbs excess vibration of the vibration plate 102, whereby reception accuracy of ultrasound is improved. For example, it is possible to suppress occurrence of noise due to disturbance vibration and reduce a time of reverberation vibration.

However, in the comparative example, since the elastic layer 104 is in contact with the vibration region Ar, a displacement amount of the vibration region Ar decreases. Therefore, reception sensitivity of ultrasound is deteriorated.

In the comparative example, the elastic layer 104 does not include the curved surface 411 in this embodiment and includes a flat surface 141 instead of the curved surface 411. Therefore, ultrasound traveling toward the ultrasonic device 110 is uniformly made incident on the entire vibration region Ar without being refracted on the elastic layer 104.

The ultrasonic device 10 in this embodiment includes the elastic layer 4 provided in contact with the vibration region Ar of the substrate 1. Therefore, as in the comparative example, the elastic layer 4 absorbs excess vibration of the vibration plate 2, whereby reception accuracy of ultrasound in the ultrasonic device 10 is improved. For example, it is possible to suppress occurrence of noise due to disturbance vibration and reduce a time of reverberation vibration.

In the ultrasonic device 10 in this embodiment, the elastic layer 4 includes the curved surface 411 recessed to the vibration plate 2 side (the −Z side) at the opposite side of the vibration plate 2 side (on the +Z side). Therefore, ultrasound traveling to the ultrasonic device 10 is refracted on the curved surface 411 at the time of incidence on the elastic layer 4 and converges toward the center portion of the vibration region Ar (see FIG. 2). Accordingly, in this embodiment, it is possible to more greatly displace the vibration region Ar compared with the comparative example. That is, in this embodiment, since the elastic layer 4 functions as an acoustic lens, it is possible to suppress a decrease in a displacement amount of the vibration region Ar by the elastic layer 4 compared with the comparative example.

Therefore, in the ultrasonic device 10 in this embodiment, it is possible to improve reception accuracy of ultrasound and suppress deterioration in reception sensitivity of ultrasound.

In this embodiment, the curvature of the curved surface 411 is set within the range of 10,000 to 20,000. With such a configuration, as explained above, the elastic layer suitably functions as the acoustic lens. Such a configuration is particularly suitable when the ultrasonic device 10 is configured as a MEMS (Micro Electro Mechanical Systems).

In this embodiment, the elastic layer 4 has the thickness of 20 μm or more and 40 μm or less in the thickness direction of the substrate 1 (the Z direction). With such a configuration, as explained above, it is possible to suitably improve reception accuracy of ultrasound and suppress deterioration in reception sensitivity of ultrasound.

Second Embodiment

A second embodiment is explained. In the second embodiment, a distance sensor 100, which is an example of an electronic device including the ultrasonic device 10 explained in the first embodiment, is explained.

Figure 5:
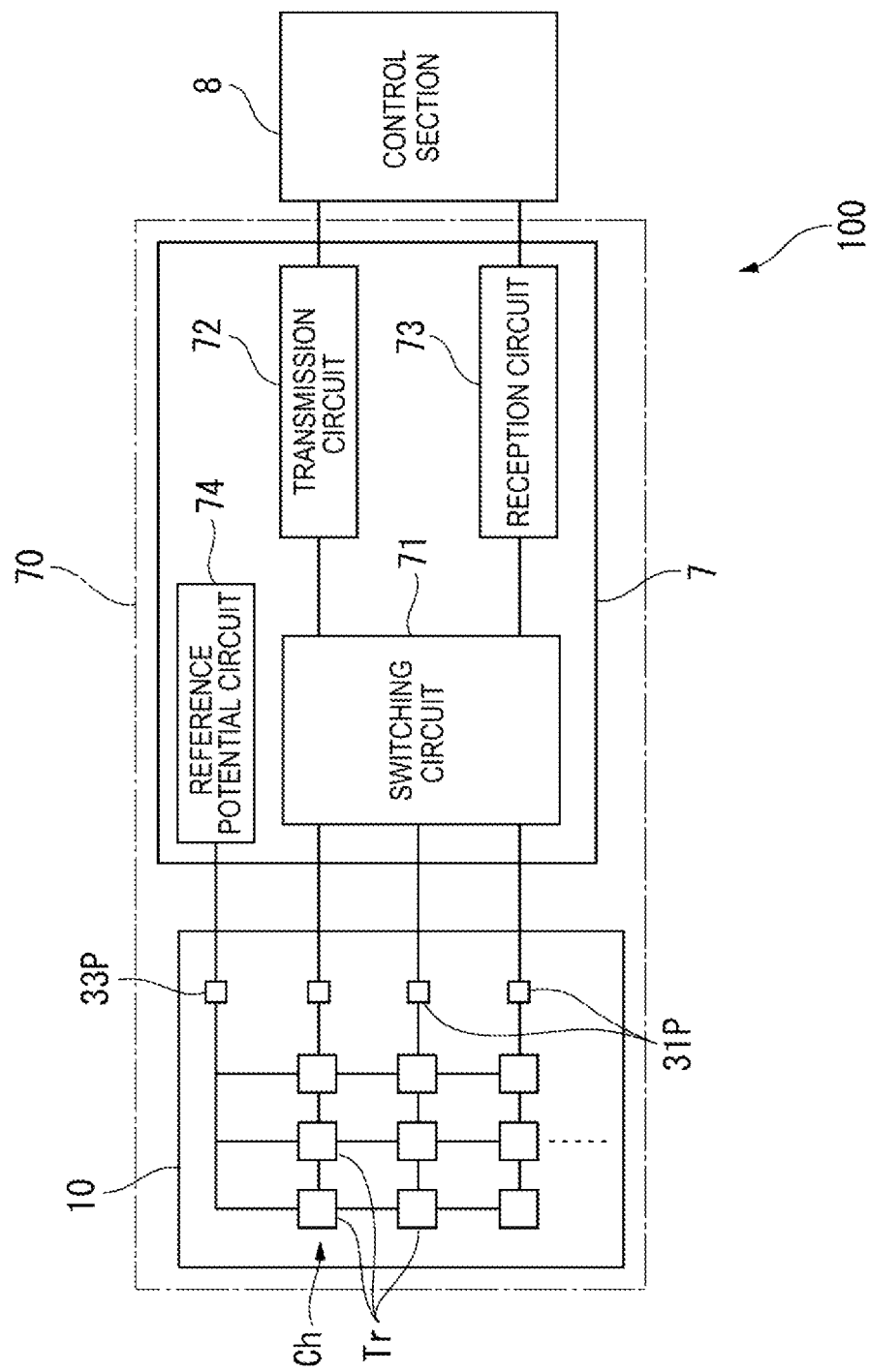
FIG. 5 is a block diagram showing a schematic configuration of an ultrasonic sensor according to a second embodiment.

As shown in FIG. 5, the distance sensor 100 in this embodiment is configured by an ultrasonic module 70 including the ultrasonic device 10 and a driving circuit 7 and a control section 8 that controls the ultrasonic module 70.

The driving circuit 7 includes a switching circuit 71, a transmission circuit 72, a reception circuit 73, and a reference potential circuit 74.

The switching circuit 71 is coupled to first electrode terminals 31P of the ultrasonic device 10, the transmission circuit 72, and the reception circuit 73. The switching circuit 71 is configured by a switching circuit. The switching circuit 71 switches transmission coupling for coupling the ultrasonic device 10 and the transmission circuit 72 and reception coupling for coupling the ultrasonic device 10 and the reception circuit 73.

The transmission circuit 72 is coupled to the switching circuit 71 and the control section 8. When the switching circuit 71 is switched to the transmission coupling, the transmission circuit 72 outputs a driving signal based on control by the control section 8 and causes the ultrasonic device 10 to transmit ultrasound.

The reception circuit 73 is coupled to the switching circuit 71 and the control section 8. When the switching circuit 71 is switched to the reception coupling, a reception signal from the ultrasonic device 10 is input to the reception circuit 73. The reception circuit 73 includes a linear noise amplifier and an A/D converter. After applying, to the reception signal, various kinds of signal processing such as conversion of the input reception signal into a digital signal, removal of a noise component, and amplification to a desired signal level, the reception circuit 73 outputs the reception signal after the processing to the control section 8.

The reference potential circuit 74 is coupled to a second electrode terminal 33P of the ultrasonic device 10. The reference potential circuit 74 applies reference potential to the second electrode terminal 33P.

The control section 8 is configured by a CPU (Central Processing Unit). The control section 8 controls the ultrasonic device 10 via the driving circuit 7 and causes the ultrasonic device 10 to carry out transmission and reception processing of ultrasound by the ultrasonic device 10. The control section 8 acquires position information of an object based on a reception signal input from the ultrasonic device 10. For example, when the ToF (Time of Flight) method is used, the control section 8 can calculate a distance from the ultrasonic device 10 to the object using a time until reception of the reception signal from transmission timing of ultrasound from the ultrasonic device 10 and sound velocity in the air.

Besides, the control section 8 may include a storing section storing various data, various programs, and the like for controlling the distance sensor 100.

With the distance sensor 100 in the second embodiment, since the distance sensor 100 includes the ultrasonic device 10 explained in the first embodiment, it is possible to improve detection accuracy and suppress deterioration in detection sensitivity.

Modification

The present disclosure is not limited to the embodiments explained above. Modifications or improvements in a range in which the object of the present disclosure can be achieved are included in the present disclosure.

Figure 6:
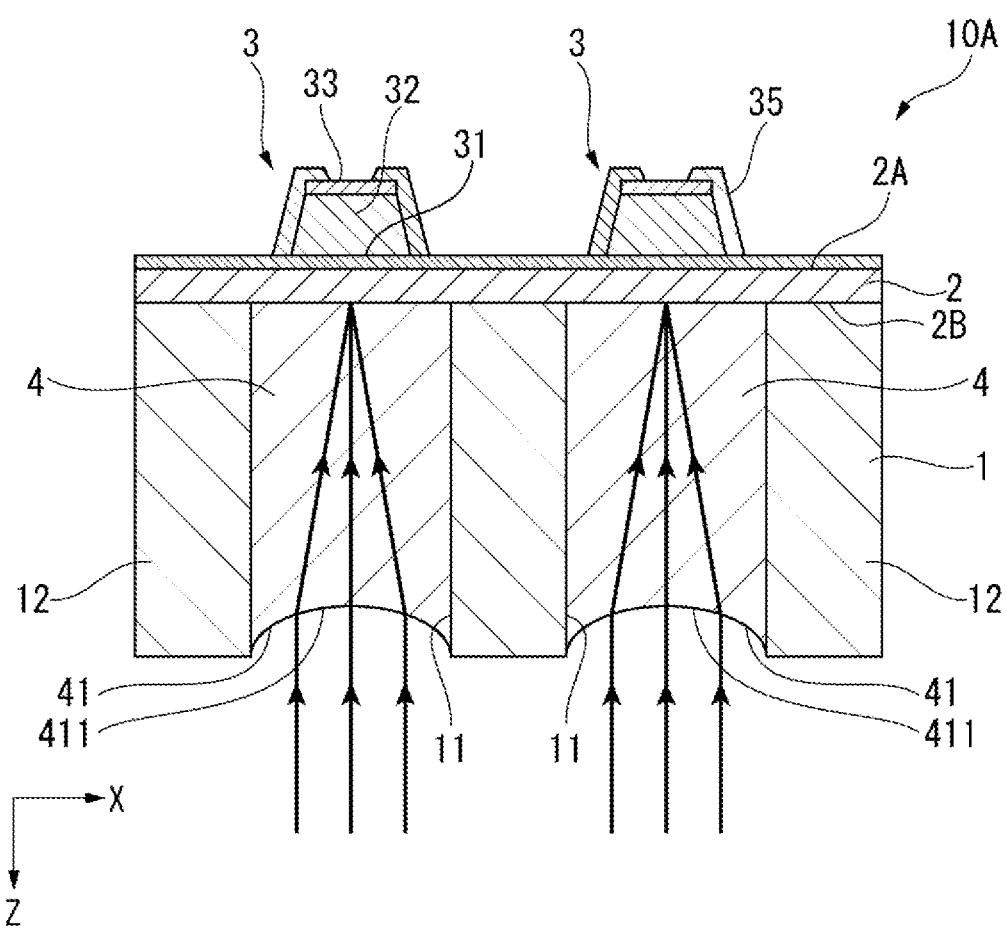
FIG. 6 is a sectional view showing another example of the ultrasonic device corresponding to the A-A line in FIG. 1.

In the first embodiment, the thickness of the elastic layer 4 is set to approximately one third of the thickness of the substrate 1. However, the present disclosure is not limited to this. For example, as shown in FIG. 6, the elastic layer 4 may have the same degree of thickness as the thickness of the substrate 1 if the elastic layer 4 does not protrude from the opening section 11. In an ultrasonic device 10A shown in FIG. 6, it is possible to suitably converge ultrasound in the vibration region Ar by setting the curvature of the curved surface 411 smaller compared with the first embodiment.

In the second embodiment, the distance sensor 100 is illustrated as an example of the ultrasonic sensor. However, the present disclosure is not limited to this. For example, the ultrasonic sensor can also be applied to an ultrasonic measurement device that measures an internal tomographic image of an object according to a transmission and reception result of ultrasound.

What is claimed is:

1. An ultrasonic device comprising:
   a substrate in which an opening section piercing through the substrate in a thickness direction is provided;
   a vibration plate provided on the substrate to close the opening section, the substrate being on a substrate side of the vibration plate;
   a piezoelectric element provided in a position corresponding to the opening section on a first surface at an opposite side of the substrate side of the vibration plate; and
   an elastic layer provided in contact with a second surface at the substrate side of the vibration plate at an inner side of the opening section of the substrate, the elastic layer being in contact with the second surface at a vibration plate side of the elastic layer, wherein
   the elastic layer includes a curved surface recessed to the vibration plate side at an opposite side of the elastic layer of the vibration plate side, and
   elastic layer has thickness of 20 μm or more and 40 μm or less in a thickness direction of the substrate.

2. The ultrasonic device according to claim 1, wherein a curvature of the curved surface is set within a range of 10,000 (1/m) to 20,000 (1/m).

3. An ultrasonic sensor comprising:
   the ultrasonic device according to claim 1; and
   a control section configured to control the ultrasonic device.

4. An ultrasonic device comprising:
   a substrate in which an opening section piercing through the substrate in a thickness direction is provided;
   a vibration plate provided on the substrate to close the opening section, the substrate being on a substrate side of the vibration plate;
   a piezoelectric element provided in a position corresponding to the opening section on a first surface at an opposite side of the substrate side of the vibration plate; and
   an elastic layer provided in contact with a second surface at the substrate side of the vibration plate at an inner side of the opening section of the substrate, the elastic layer being in contact with the second surface at a vibration plate side of the elastic layer, wherein
   the elastic layer includes a curved surface recessed to the vibration plate side at an opposite side of the elastic layer of the vibration plate side, and
   a curvature of the curved surface is set within a range of 10,000 (1/m) to 20,000 (1/m).

5. The ultrasonic device according to claim 4, wherein the elastic layer has thickness of 20 μm or more and 40 μm or less in a thickness direction of the substrate.

6. An ultrasonic sensor comprising:
   the ultrasonic device according to claim 4; and
   a control section configured to control the ultrasonic device.

* * * * *